US008357977B2

(12) United States Patent
Kaigawa

(10) Patent No.: US 8,357,977 B2
(45) Date of Patent: Jan. 22, 2013

(54) SEMICONDUCTOR DEVICE AND METHOD FOR MANUFACTURING SAME

(75) Inventor: Hiroyuki Kaigawa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 155 days.

(21) Appl. No.: 13/125,774

(22) PCT Filed: Oct. 22, 2009

(86) PCT No.: PCT/JP2009/005574
§ 371 (c)(1),
(2), (4) Date: Apr. 22, 2011

(87) PCT Pub. No.: WO2010/050160
PCT Pub. Date: May 6, 2010

(65) Prior Publication Data
US 2011/0193168 A1    Aug. 11, 2011

(30) Foreign Application Priority Data

Oct. 27, 2008   (JP) ................................. 2008-276024

(51) Int. Cl.
*H01L 21/70* (2006.01)
(52) U.S. Cl. .......... 257/368; 257/72; 257/343; 257/344; 257/E29.117; 438/149; 438/151
(58) Field of Classification Search ........................ None
See application file for complete search history.

(56) References Cited

U.S. PATENT DOCUMENTS

| 6,777,716 B1 | 8/2004 | Yamazaki et al. |
| 2005/0266595 A1 | 12/2005 | Lee |

FOREIGN PATENT DOCUMENTS

| JP | 2000-299469 A | 10/2000 |
| JP | 2001-77373 A | 3/2001 |
| JP | 2001-320053 A | 11/2001 |
| JP | 2002-76351 A | 3/2002 |
| JP | 2003-188384 A | 7/2003 |
| JP | 2005-243938 A | 9/2005 |
| JP | 2005-328088 A | 11/2005 |
| JP | 2005-346053 A | 12/2005 |

OTHER PUBLICATIONS

International Search Report (ISR) issued in PCT/JP2009/005574 (International application) mailed in Dec. 2009 for Examiner consideration.

*Primary Examiner* — Tan N Tran
*Assistant Examiner* — Scott R Wilson
(74) *Attorney, Agent, or Firm* — Chen Yoshimura LLP

(57) ABSTRACT

A method for manufacturing a semiconductor device, which includes the steps of: forming a mask layer (20) on a gate insulating film (18), the mask layer (20) having openings over the portions of first and second semiconductor layers that are destined to become low-concentration impurity regions and source and drain regions; forming first conductivity type implantation regions (24b, 24c) in the first and second semiconductor layers respectively by implanting a first conductivity type impurity (22) to the first and second semiconductor layers through the openings in the mask layer (20); forming first and second gate electrodes (26b, 26c) to cover a portion of the first conductivity type implantation regions and portions of the first and second semiconductor layers that are destined to become channel regions; forming another mask layer (28) which has openings over portions of the first conductivity type implantation region (24b) of the first semiconductor layer, said portions being located at both ends of the first semiconductor layer, the entire second semiconductor layer, and a portion of a third semiconductor layer; and implanting the first conductivity type impurity into the first, second, and third semiconductor layers through the openings in the another mask layer (28).

11 Claims, 9 Drawing Sheets

(a)

(b)

(a)

(b)

Control signals are sent to the backlight circuit

SEMICONDUCTOR DEVICE AND METHOD FOR MANUFACTURING SAME

TECHNICAL FIELD

The present invention relates to a semiconductor device and a method for manufacturing the same.

BACKGROUND ART

Semiconductor devices equipped with thin film transistors (TFTs) have been under development in recent years. Active matrix liquid crystal display devices and organic EL display devices and the like are major examples of such semiconductor devices. Those display devices have been used for various electronics including portable electronic devices such as cellular phones.

A number of thin film transistors (TFTs) are used as switching elements in display regions in active matrix display devices. TFTs are generally classified into amorphous silicon TFTs and crystalline silicon TFTs, depending on the crystallinity of the silicon thin films used. Because the field effect mobility in a crystalline silicon film is generally higher than that in an amorphous silicon film, crystalline silicon TFTs can operate faster than amorphous silicon TFTs. For this reason, by using a crystalline silicon film, not only TFTs provided as switching elements for each of the pixels ("pixel TFTs") but also TFTs constituting the peripheral circuits such as driver circuits and various operational circuits disposed in the periphery of the display region ("driver circuit TFTs") can be formed on the same substrate.

Recently, formation of photodiodes on the same substrate with pixel TFTs and driver circuit TFTs has been suggested for uses in display devices having photo sensor features, such as touchscreen display devices and display devices with ambient light sensors.

Here, pixel TFTs and driver circuit TFTs preferably have different structures, matched to their respective required properties.

The maximum allowable off-leakage current of pixel TFTs is very low. This is because in liquid crystal display devices, a voltage applied to liquid crystals needs to be maintained for one frame, until the display is refreshed, and a high OFF current (off-leakage current) of the pixel TFT causes the voltage applied to the liquid crystals to drop during this period of time, which can degrade the display properties.

A known structure of pixel TFTs is the structure having a Lightly Doped Drain region (herein after may be referred to as "LDD region") disposed at least either between TFT's channel region and the source region or between the channel region and the drain region. Such structure is called "LDD structure." In the TFT having this structure, the LDD region, which has a higher resistance than the source or drain region, is disposed between an edge of the gate electrode and the low-resistant source or drain region. Compared with a TFT without a LDD region (single drain structure), the TFT having the LDD structure can reduce the off-leakage current substantially. Moreover, with the LDD region, the electric field in the vicinity of the drain becomes less concentrated and thus, hot-electron-induced degradation can be suppressed. "Hot-electron-induced degradation" refers to a fluctuation in the transistor properties caused when a portion of hot electrons generated by the electric field concentration in the vicinity of the drain enter into the gate insulating film, and/or create a defect levels in the silicon film. Only a portion of the LDD region may overlap the gate electrode, and from this a similar effect can be obtained. One drawback of the LDD-structured TFT is that the LDD region becomes a resistor, which makes the current drive power lower than that of the single-drain TFT.

On the other hand, since the driver circuit TFT is required to operate at a high speed, the driver circuit TFT needs a high current drive power, that is, a high ON current.

One known structure of a driver circuit TFT is a structure in which the LDD region overlaps the gate electrode. This structure is called a "GOLD (Gate Overlapped LDD) structure." When a voltage is applied to the gate electrode on a GOLD-structured TFT, electrons that will become carriers are accumulated in the LDD region that overlaps the gate electrode. This lowers the resistance of the LDD region, minimizing the reduction in the TFT's current drive power. Since this structure can also lower the impurity concentration in the LDD region more than the aforementioned TFT of LDD structure (the structure in which at least a portion of the LDD region does not overlap the gate electrode), the electric field concentration near the drain can be more effectively moderated, and therefore the hot electron degradation resistance is substantially improved.

However, the GOLD-structured TFT has a drawback of a higher off-leakage current than the aforementioned LDD-structured TFT, which makes the GOLD-structured TFT unsuitable to be used as a pixel TFT. This drawback is considered to be a result of the formation of an accumulation layer in the LDD region that overlaps the gate electrode even when the TFT is in the OFF state.

Therefore, for each TFT application and purpose of the use, the most appropriate TFT structure needs to be selected. That is, for example, in manufacturing an active matrix substrate in which a driver circuit is integrated, the pixel TFT and driver circuit TFT, whose structures are different from each other, need to be formed on the same substrate.

Patent Document 1 discloses a method of forming a driver circuit TFT and a pixel TFT on the same substrate. With this method, after forming on the substrate a plurality of semiconductor layers that are destined to become active layers for the driver circuit TFT and pixel TFT, first, impurity ion implantation for formation of an LDD region is conducted using a resist mask (this is called the first low-concentration impurity implantation), which is targeted only to the semiconductor layer that is destined to become the active layer for the driver circuit TFT. With this method, a gate electrode is formed on each semiconductor layer after the first low-concentration impurity implantation. Next, impurity ion implantation for formation of an LDD region is performed on the semiconductor layer that is destined to become the active layer for the pixel TFT (the second low-concentration impurity implantation) using the gate electrode as a mask. Then, high-concentration impurity ion implantation is performed to the semiconductor layers that are destined to become the active layers for the driver circuit TFT and pixel TFT, to form source and drain regions. In this way, the pixel TFT having LDD structure and the driver circuit TFT having GOLD structure are formed.

According to the method disclosed in Patent Document 1, the low-concentration impurity implantation is performed before and after the formation of the gate electrodes. This means that the method requires additional manufacturing steps, and therefore, leads to a higher production cost, compared with the case in which multiple TFTs having the same structure are formed.

In order to reduce the number of manufacturing steps and lower the production cost, and to increase productivity, it is important to reduce the number of photomasks used for producing the TFTs, even by just one. Photomasks are used in photolithography to form resist patterns that will become masks for etching or ion implantation. Therefore, one additional photomask means additional etching or ion implantation, as well as additional steps of forming resist patterns in photolithography, removing the resist pattern, and washing and drying. Resist pattern formation by lithography, in particular, involves many cumbersome steps including resist application, pre-baking, exposure, development and post-baking. One additional photomask, therefore, is accompanied by additional manufacturing steps, resulting in increased production cost, longer required lead time, and significantly decreased productivity.

For this reason, various processes for reducing the number of photomasks, even by just one, have been proposed (Patent Documents 2 through 5).

For example, with the methods proposed in Patent Documents 2 and 5, a double-layered gate electrode is formed on the semiconductor layer. Using the gate electrode as a mask, a high-concentration impurity implantation is performed on the semiconductor layer to form the source/drain regions. Then, only the top layer of the gate electrode is etched to narrow the width. Next, using the narrowed width top layer of the gate electrode as a mask and through the bottom layer, the low-concentration impurity implantation is conducted on the semiconductor layer to form an LDD region. With this method, a GOLD-structured TFT can be formed using a single photomask. Patent Document 3 proposes a method in which a double-layered gate electrode, with a wider bottom layer and a narrower top layer, is formed on each of the plurality of semiconductor layers on the substrate, and the LDD-structured TFT and the GOLD-structured TFT are formed separately, utilizing this structure of the gate electrodes.

Patent Document 6 discloses a method in which a resist mask is formed on each of the semiconductor layers that are destined to become active layers for GOLD-structured TFT and LDD-structured TFT respectively, to cover regions destined to become the channel regions, followed by the low-concentration impurity ion implantation. In this method, after the low-concentration impurity ion implantation is conducted, the aforementioned resist mask is removed. Then, a gate electrode that is somewhat larger than the removed resist mask is formed on the semiconductor layer that is destined to become the active layer for the GOLD-structured TFT. Also, on a semiconductor layer that is destined to become the active layer for the LDD-structured TFT, a gate electrode, which is the same size as the removed resist mask, is formed to cover the portion that is destined to become the channel region. Next, a mask is formed on the semiconductor layer that is destined to become the active layer for the LDD-structured TFT to cover the region to be preserved as the LDD region. Then, the high-concentration impurity ion implantation is conducted on these semiconductor layers to form the source/drain regions. This method eliminates the need to repeat the low-concentration impurity ion implantation twice as in the method of Patent Document 1.

RELATED ART DOCUMENTS

Patent Documents

Patent Document 1: Japanese Patent Application Laid-Open Publication No. 2005-328088
Patent Document 2: Japanese Patent Application Laid-Open Publication No. 2002-76351
Patent Document 3: Japanese Patent Application Laid-Open Publication No. 2005-243938
Patent Document 4: Japanese Patent Application Laid-Open Publication No. 2001-77373
Patent Document 5: Japanese Patent Application Laid-Open Publication No. 2001-320053
Patent Document 6: Japanese Patent Application Laid-Open Publication No. 2005-346053

SUMMARY OF THE INVENTION

Problems to be Solved by the Invention

With the methods described in Patent Documents 2 and 3, the gate electrode is etched twice. The double etching makes it difficult to control the width of the gate electrode, which can lead to a variation in the drive performance of TFTs.

With the method described in Patent Document 6, a gate electrode that are the same size as the removed resist mask is formed on a semiconductor layer that is destined to become the active layer for the LDD-structured TFT. That is, the resist mask used in the low-concentration ion implantation is approximately the same size as the gate electrode to be formed later. Therefore, any misalignment of the gate electrode results in a misalignment of the gate electrode position and the position of the semiconductor layer portion to which low-concentration impurity ions were not implanted (the channel region). As a result, a high resistance region is formed between an edge of the gate electrode and the LDD region, which can significantly increase the ON resistance.

Therefore, using conventional methods, it is difficult to reduce the number of photomasks used while maintaining the reliability of semiconductor elements such as TFTs.

Furthermore, in semiconductor devices such as active matrix substrates in which driver circuits are integrated, n-channel type TFTs of the single-drain structure and p-channel type TFTs of the single-drain structure as well as n-channel type TFTs of the LDD structure and of the GOLD structure are sometimes formed on the same substrate. Also, for an active matrix substrate to be used in a display device having a photo sensor feature, the aforementioned TFTs and diodes are preferably formed simultaneously on the same substrate. In forming TFTs of various structures and diodes (TFDs) in this way, the number of required photomasks increases, and the manufacturing process becomes very complex. Therefore, it is important to reduce the number of photomasks without sacrificing the reliability of the elements.

The present invention was devised in consideration of the issues described above, and is aimed at improving the productivity in the manufacturing method of semiconductor devices having multiple types of semiconductor elements including the LDD-structured TFTs, GOLD-structured TFTs, and TFDs on the same substrate, by reducing the number of required photomasks without lowering the reliability of the semiconductor elements.

Means for Solving the Problems

A manufacturing method of a semiconductor device of the present invention is a manufacturing method for semiconductor device having at least two thin film transistors and a diode on a same substrate, including the steps of: (a) forming island-shaped first and second semiconductor layers for formation of thin film transistors, and an island-shaped third semiconductor layer for formation of a diode; (b) forming a gate insulating film covering the first, second, and third semiconductor layers; (c) forming a mask layer having openings exposing portions of the gate insulating film that are located over portions of the first and second semiconductor layers, which portions are destined to become low-concentration impurity regions and source and drain regions, respectively; (d) forming first conductivity type implantation regions in the first and second semiconductor layers, by implanting a first conductivity type impurity to the first and second semiconductor layers through the openings of the mask layer from above the gate insulating film; (e) forming on the gate insulating film a first gate electrode and a second gate electrode covering a portion of the first conductivity type implantation region and a region that is destined to become the channel region of the first and second semiconductor layers, respectively; (f) forming another mask layer having openings exposing portions of the gate insulating film, which portions are located over two end portions of the first conductivity type implantation region of the first semiconductor layer, the entire second semiconductor layer, and a portion of the third semiconductor layer; and (g) implanting the first conductivity type impurity into the first, second and third semiconductor layers, through openings in the another mask from above the gate insulating film to form source/drain regions in the first semiconductor layer, source/drain regions in portions of the second semiconductor layer which are not covered by the second gate electrode, and a first conductivity type region in the third semiconductor layer to form regions of the first conductivity type implantation region where the source/drain regions are not formed as low-concentration impurity regions.

In a preferred embodiment, the aforementioned manufacturing method for a semiconductor device further includes the step of (h) implanting a second conductivity type impurity, which is different from the first conductivity type impurity, into another portion of the third semiconductor layer to form a second conductivity type region in the third semiconductor layer.

In a preferred embodiment, the aforementioned step (a) further includes a step of forming island-shaped fourth semiconductor layer for forming another thin film transistor, the step including the steps of: (i1) forming a fourth gate electrode covering a portion of the fourth semiconductor layer that is destined to become a channel region, and (i2) implanting the second conductivity type impurity into the fourth semiconductor layer using the fourth gate electrode as a mask to form source and drain regions in the fourth semiconductor layer, wherein the step (i1) and the step (e) are conducted simultaneously, and the step (i2) and the step (h) are conducted simultaneously.

In the steps (d) and (g), the first conductivity type impurity is preferably not implanted into the fourth semiconductor layer.

The step (d) may further include the step of implanting the first conductivity type impurity into the entire fourth semiconductor layer.

In a preferred embodiment, the step (a) further includes the step of forming an island-shaped fifth semiconductor layer for forming another thin film transistor, the step including the step of (j1) forming a fifth gate electrode covering a portion of the fifth semiconductor layer that is destined to become a channel region; and (j2) implanting the first conductivity type impurity to the fifth semiconductor layer using the fifth gate electrode as a mask to form source and drain regions in the fifth semiconductor layer, wherein the first conductivity type impurity is not implanted into the fifth semiconductor layer in the step (d), and the step (j1) and the step (e) are conductive simultaneously, and the step (j2) and the step (g) are conducted simultaneously.

The first conductivity type may be n-type, and the second conductivity type may be p-type.

The semiconductor device of the present invention is a semiconductor device having a first thin film transistor, a second thin film transistor, and a diode on a same substrate, wherein each one of the first and second thin film transistors has a semiconductor layer including a channel region, source/drain regions respectively disposed adjacent to respective sides of the channel region, and low concentration impurity regions interposed between the channel region and the drain region and between the channel region and the source region, the low concentration impurity regions containing a first conductivity type impurity at a lower concentration than the source region and the drain region; a gate insulating film formed on the semiconductor layer; and a gate electrode disposed in such a manner as to overlap at least with the channel region; the diode has a semiconductor layer including a first conductivity type region containing the first conductivity type impurity and a second conductivity type region containing the second conductivity type impurity; in the first thin film transistor, the gate electrode overlaps with a portion of the low concentration impurity region; in the second thin film transistor, the gate electrode overlaps with the entire low concentration impurity region; and the low concentration impurity regions and the source/drain regions of each one of the first and second thin film transistors have the same impurity element; concentration profiles of the first conductivity type impurity in the direction of a thickness of the low concentration impurity regions of the first thin film transistor and in the direction of a thickness of the low concentration impurity regions of the second thin film transistor are substantially the same; and concentration profiles of the first conductivity type impurity in the direction of a thickness of the source/drain regions of the first thin film transistor and of the source and drain regions of the second thin film transistor are substantially the same In a preferred embodiment, in the second thin film transistor, an end of the gate electrode is aligned with an end of the source region or the drain region; and, in the first thin film transistor, an end of the gate electrode is not aligned with any of an end of the low concentration impurity region, an end of the source region, or an end of the drain region.

The semiconductor device may further include a third thin film transistor formed on the substrate, wherein the third thin film transistor has a semiconductor layer including a channel region, and source/drain regions respectively disposed on respective sides of the channel region and containing the second conductivity type impurity, a gate insulating film formed on the semiconductor layer, and a gate electrode disposed on the gate insulating film; concentration profiles of the second conductivity type impurity in the direction of a thickness of a second conductivity type region of the diode and of the source/drain regions of the third thin film transistor are substantially the same; and the source/drain regions of the third thin film transistor do not contain the first conductivity type impurity.

The aforementioned semiconductor device may further include a fourth thin film transistor formed on the substrate, wherein the fourth thin film transistor has a semiconductor layer including a channel region, source/drain regions respectively disposed on respective sides of the channel region and containing the first conductivity type impurity, a gate insulating film formed on the semiconductor layer, and a gate electrode disposed on the gate insulating film; concentration profiles of the first conductivity type impurity in the direction of a thickness of a first conductivity type region of the diode and of the source/drain regions of the fourth thin film transistor are substantially the same; and in the fourth thin film transistor, ends of the source/drain regions of the fourth thin film transistor are aligned with ends of the gate electrode.

EFFECT Of The INVENTION

The present invention can provide a highly-reliable semiconductor device with a manufacturing method that is productive and simple. In particular, by using the same ion implantation step for the formation of the LDD regions for the LDD-structured TFT and for the GOLD-structured TFT, the number of photomasks to be used can be reduced. Also, the same ion implantation step may be used for forming the TFT's source region and drain region, and for forming the TFD's n-type region or p-type region, which can further reduce the number of photomasks to be used.

Furthermore, a TFT whose conductivity type is opposite the conductivity type of the aforementioned TFT may be formed on the same substrate on which the aforementioned TFT and TFD are formed. This configuration is preferable because the source region and the drain region of the TFT of the opposite conductivity type can be formed without the need to increase the steps of manufacturing or perform the counter doping.

The present invention is preferably used in an active matrix substrate to which a driver circuit is integrated. By using the LDD-structured TFT for a pixel TFTs and the GOLD-structured TFT for a driver circuit TFT, a pixel TFT that is excellent with OFF characteristics and a driver circuit TFT that are excellent with ON characteristics can be obtained. Furthermore, diodes may be used in circuits such as driver circuits, and may be operated as photo sensors.

BRIEF DESCRIPTION OF THE DRAWINGS

FIG. 3(a) shows the case where the thin film transistor is manufactured as designed, and (b) illustrates the case where a misalignment has occurred.

FIG. 4(a) shows the case where the thin film transistor is manufactured as designed, and FIG. 4(b) illustrates the case where a misalignment has occurred.

DETAILED DESCRIPTION OF EMBODIMENTS

Figure 1:
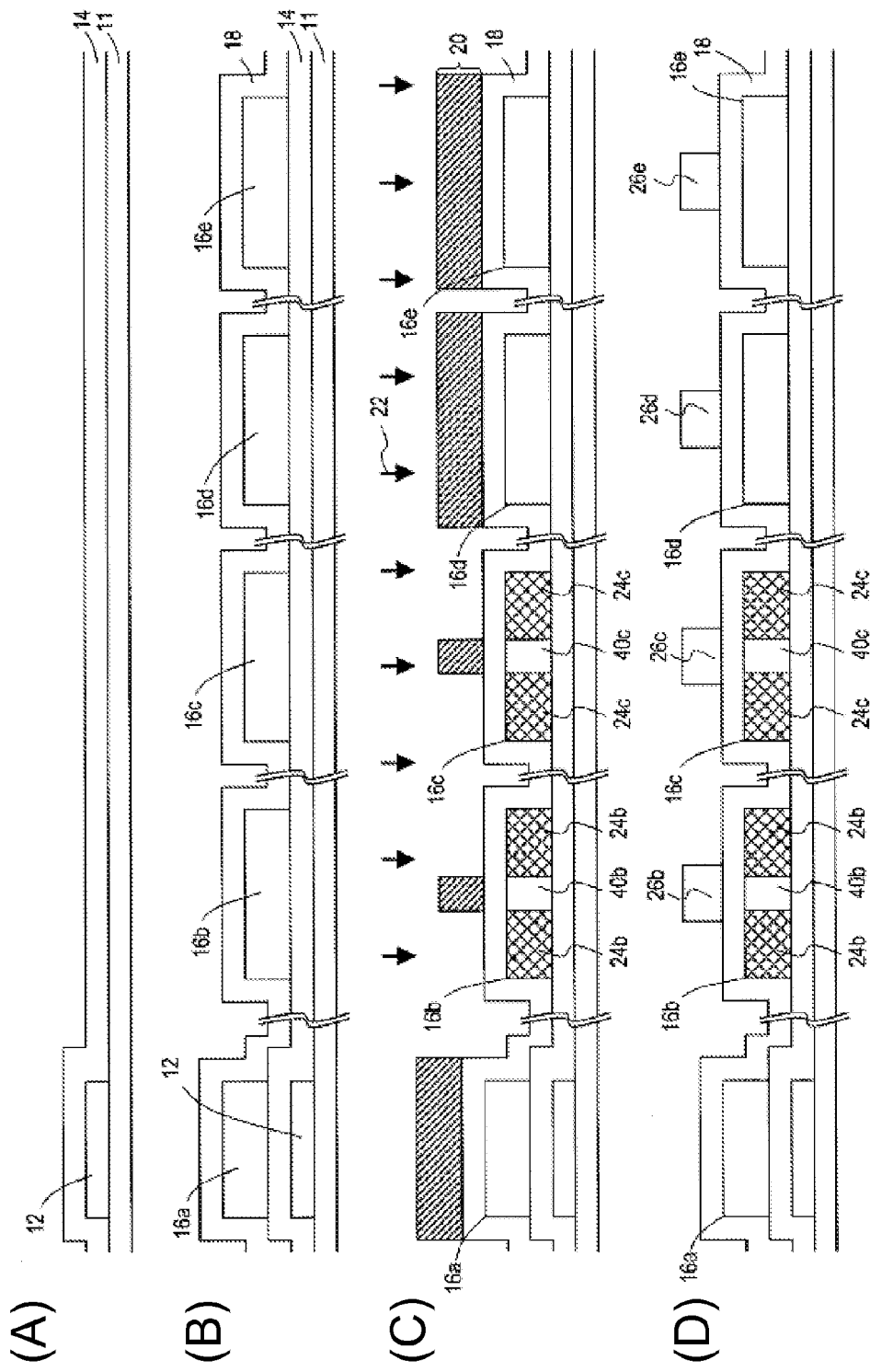
FIGS. 1(A) through 1(D) are schematic cross-sectional views illustrating the manufacturing steps for the semiconductor device according to Embodiment 1 of the present invention.

Embodiments of the semiconductor device of the present invention are described below with reference to the figures. In this specification, a "semiconductor device" refers to a wide variety of devices, including a substrate having operational circuits, active matrix substrate, and a display device such as a liquid crystal display device or an organic EL display device.

(Embodiment 1)

Below, referring to the figures, a manufacturing method of a semiconductor device according to Embodiment 1 of the present invention is described. Described is the method of forming, using the same semiconductor layer, a diode (TFD), an n-channel type TFT of LDD structure, an n-channel type TFT of GOLD structure, an n-channel type TFT of the single drain structure, and a p-channel type TFT of the single drain structure on the same substrate.

FIGS. 1(A) through 1(D) and FIGS. 2(E) through 2(G) are schematic cross-sectional views showing a method for manufacturing the semiconductor device according to this embodiment.

First, as shown in FIG. 1(A), a light shielding layer 12 (approximately 30 to 200 nm thick, for example) is formed on the surface of a substrate 11, in the region where a TFD is to be formed. Then, an insulating film 14 (approximately 500 nm thick, for example) is formed covering the substrate 11.

The substrate 11 can be any substrate having an insulating surface, such as a silicon (Si) substrate or a metal substrate covered with an insulating layer as well as a quartz or glass substrate. The shielding layer 12 can be formed by depositing a metal film or silicon film, and by patterning the film. As for the metal film, one made of tantalum (Ta), tungsten (W), or molybdenum (Mo), all having a high melting point, is preferably used, in consideration of the heat treatment in later manufacturing process. In this embodiment, the light shielding layer 12 is disposed in such a manner as to shield the light coming from the back side of the substrate toward the TFD in the final product. The insulating film 14 is formed, for example, by the plasma CVD method. The insulating film 14 may be a silicon oxide film, silicon nitride film, or a silicon oxynitride film.

Next, as shown in FIG. 1(B), island-shaped semiconductor layers 16a through 16e are formed on the insulating film 14, and then, a gate insulating film 18 (approximately 100 nm thick, for example) is formed covering the semiconductor layers 16a through 16e.

The semiconductor layers 16a through 16e are formed by using crystalline semiconductor films (crystalline silicon films). More specifically, first, a semiconductor film of the amorphous structure (in this case, amorphous silicon films) is deposited using a known method such as plasma CVD or sputtering. The thickness of the amorphous silicon film is 20 nm or greater and 100 nm or less, for example. When the insulating film 14 and the amorphous silicon film are formed using the same method, the two may be formed continuously. After this, the amorphous silicon film is crystalized to obtain a crystalline silicon film. The crystallization of the amorphous silicon film can be done with a conventional method.

For example, the amorphous silicon film may be exposed to a laser beam for crystallization. As for the laser beam, a pulsed or continuous-wave excimer laser is preferably used, but a continuous-wave argon laser may also be utilized. Also, the amorphous silicon film can be crystallized by a heat treatment (for example, laser irradiation) after the surface of the amorphous silicon is coated with a catalyst element such as nickel (Ni). The crystalline silicon film thus obtained is patterned by photolithography and etching to form a plurality of the island-shaped semiconductor layers 16a through 16e.

In FIG. 1(B), as a simplified example, a semiconductor layer 16a, which is destined to become an active layer for a diode, a semiconductor layer 16b, which is destined to become an active layer for an LDD-structured n-channel type TFT, a semiconductor layer 16c, which is destined to become an active layer for an GOLD-structured n-channel type TFT, a semiconductor layer 16d, which is destined to become an active layer for a single drain structured n-channel-type TFT, and a semiconductor layer 16e, which is destined to become an active layer for a p-channel type TFT, are arranged. However, the actual number and arrangement of these semiconductor layers are not limited to this example.

As for the gate insulating film 18, a silicon oxide ($SiO_2$) film having a thickness of 100 nm, for example, is formed. The gate insulating film 18 may be formed by the CVD method.

Next, as shown in FIG. 1(C), a mask layer 20, which is a resist film, is formed. The mask layer 20 has openings for exposing portions of the gate insulating film 18 that are located over portions of semiconductor layer 16b and 16c that are destined to become the LDD regions and the source/drain regions. Subsequently, impurity ions 22 are implanted into the semiconductor layers 16b and 16c through the openings in the mask layer 20 to form impurity ion implantation regions 24b and 24c in semiconductor layers 16b and 16c, which regions 24b and 24c contain the impurity ions 22 at a low concentration. Since the semiconductor layers 16a, 16d, and 16e are entirely masked by the mask layer 20, the impurity ions 22 are not implanted on these semiconductor layers.

In this embodiment, phosphorous ions are used as the impurity ions 22. The ion implantation is performed at an accelerating voltage of 80 kV, for example, and the dose is set to $1\times10^{13}/cm^2$. The portions of the semiconductor layers 16b and 16c where the impurity ions 22 were not implanted will become channel regions 40b and 40c, respectively.

Next, the mask layer 20 is removed and gate electrodes 26b through 26e are formed on the semiconductor layers 16b through 16e, respectively, as shown in FIG. 1(D). The gate electrodes 26b and 26c are formed in such a manner as to cover the channel regions 40b and 40c, and also portions of the impurity ion implantation regions 24b and 24c (portions adjacent to both sides of the channel regions 40b and 40c) of the semiconductor layers 16b and 16c. The gate electrodes 26d and 26e are formed in such a manner as to cover the portion of the semiconductor layers 16d and 16e, which are destined to become the channel regions. In order to form the gate electrodes 26b through 26e, for example, a tungsten (W) film (e.g. approximately 400 nm thick) is formed on the gate insulating film 18 by sputtering or the like method; a photoresist is developed on the W film; and the W film is etched using the photoresist as a mask. The gate electrodes 26b through 26e may be formed by patterning a multilayered film made of, for example, a TaN film and a W film.

Next, as shown in FIG. 2(E), mask layer 28, which is a resist film (not shown), having openings that expose portions of the gate insulating film 18 that are located over a portion of semiconductor layer 16a and over portions of semiconductor layer 16e that are destined to become source/drain regions, is formed. Subsequently, through the openings in the mask layer 28, p-type impurity ions 30 are implanted into the semiconductor layers 16a and 16e. As a result of this ion implantation, p-type impurity region 46 is formed in the semiconductor layer 16a, and source and drain regions 42e are formed in the semiconductor layer 16e. A portion of the semiconductor layer 16e where impurity ions 30 were not implanted will become channel region 40e. Since the semiconductor layers 16b through 16d are masked entirely by the mask layer 28, the impurity ions 30 are not implanted in these semiconductor layers.

In this embodiment, boron ions are implanted as the impurity ions 30. The ion implantation is performed at an accelerating voltage of 80 kV, for example. the dose applied in this step may be set to, for example, $3\times10^{15}/cm^2$ or an amount greater than the dose applied in the ion implantation step illustrated in FIG. 1(C).

Next, the mask layer 28 is removed. Then, as shown in FIG. 2(F), another mask layer, i.e. mask layer 32, which is a resist film (approximately 1.5 μm thick, not shown), is formed. The mask layer 32 has openings exposing portions of the gate insulating film 18 that are located over a portion of semiconductor layer 16a that is not the p-type region 46 of semiconductor layer 16a, over the both end portions of the regions 24b of the semiconductor layer 16b where impurity ions 24 were implanted (the end portions are destined to become the source/drain regions), and over the semiconductor layers 16c and 16d. Then, n-type impurity ions 34 are implanted at a high concentration from above the mask layer 32 and the gate insulating film 18. By this implantation, an n-type region 48 is formed on the semiconductor layer 16a, and source/drain regions 42b are formed on the semiconductor layer 16b. Also, part of the semiconductor layers 16c and 16d not covered with the gate electrodes 26c and 26d will become source/drain regions 42c and 42d, respectively. Part of semiconductor layer 16a where the impurity ions 30 were not implanted in the previous step (FIG. 2(E)) and the impurity ions 34 were not implanted in this step will become intrinsic region 50. Part of the impurity ion implantation regions 24b and 24c of the semiconductor layers 16b and 16c where the impurity ions 34 were not implanted will become lightly-doped (LDD) regions 44b and 44c. Part of the semiconductor layer 16d where the impurity ions 34 were not implanted will become a channel region 40d.

In this embodiment, phosphorus ions are used for the impurity ions 34. The accelerating voltage for the ion implantation is set to 50 kV. The dose for this step may be set to, for example, $3\times10^{15}/cm^2$ or an amount greater than the dose applied in the ion implantation step illustrated in FIG. 1(C).

Next, the mask layer 32 is removed. Then, the impurity ions in the n-type region 48, p-type region 46, LDD regions 44b and 44c, and source/drain regions 42b through 42e are activated by a heat treatment. The heat treatment that can be used includes furnace annealing, lamp annealing, and laser annealing.

Next, as shown in FIG. 2(G), an interlayer insulating film 36 is formed to cover the gate electrodes 26b through 26e and the semiconductor layers 16a through 16e. The interlayer insulating film 36 may have a multilayer structure that is made of SiN film and $SiO_2$ film. After the contact holes leading, respectively, to n-type region 48 and p-type region 46 of the semiconductor layer 16a, and the source/drain regions 42b through 42e of the semiconductor layers 16b through 16e are formed in the interlayer insulating film 36, a conductive film (not shown) is formed on the interlayer insulating film 36 (including the inside of the contact hole), by sputtering or the like method. Electrodes 38a through 38e of desired shapes are formed of this conductive film, by a method such as photolithography and etching. In this manner, diode 100a, n-channel type thin film transistors 100b through 100d, and p-channel type thin film transistor 100e are obtained.

With the aforementioned method, since the self-alignment process is used in fabricating the thin film transistor 100c, an end of the source/drain region 42c adjoining the LDD region 44c is aligned with one of the ends of the gate electrode 26c. On the other hand, in the fabrication of the thin film transistor 100b, the self-alignment process using the gate electrode 26b as a mask is not employed in the ion implantation at a low concentration or the ion implantation at a high concentration to the thin film transistor 100b. Therefore, the edges of gate electrode 26b do not align with any of the edges of the LDD regions 44b or the source or drain region 42b.

In the thin film transistor 100b, part of the LDD regions 44b does not overlap with the gate electrode 26b (LDD structure). In such configuration, because the LDD regions 44b are interposed between the ends of the gate electrode 26b and the ends of the source/drain regions 42b, off-leakage current can be suppressed. Therefore, when the semiconductor device according to this embodiment is used in a display device, the thin film transistor 100b is preferably used as a pixel TFT. As described below, by setting the width of the gate electrode 26b, which is along the channel direction, sufficiently wider than the width of the channel region 40b (channel length), lowering of the ON characteristics due to misalignment can be prevented.

In the thin film transistor 100c, the gate electrode 26c overlaps with the entire LDD regions 44c and the channel region 40c (GOLD structure). Because this structure can moderate the electric field concentration in the end portion of the electrode 26c, hot-electron-induced deterioration can effectively be controlled. Also, as the entire LDD regions 44c are overlapped with the gate electrode 26c, electrons can be accumulated in the LDD regions 44c when a voltage is applied to the gate electrode 26c. As a result, decrease in the ON current caused by the LDD regions 44c can be prevented. Therefore, when the semiconductor device according to this embodiment is utilized in a display device, the thin film transistor 100c can preferably be used as a driver circuit TFT.

In this embodiment, "LDD regions" refers to the regions where the impurity concentration is $3 \times 10^{17}$ atoms/cm$^3$ or greater and is lower than the impurity concentration in the source and drain regions. Therefore, these "LDD regions" do not include regions of semiconductor layers containing impurities at a very low concentration (less than $3 \times 10^{17}$ atoms/cm$^3$). For example, although part of impurities implanted in the LDD regions can diffuse into the channel regions which are disposed below the gate electrodes, such regions are not considered as the "LDD regions" because the impurity concentration of regions into which the impurities have diffused is very low.

According to this embodiment, impurity implantation at a low concentration and impurity implantation at a high concentration are respectively conducted simultaneously for semiconductor layers 16b and 16c, which are destined to become thin film transistors 100b and 100c respectively. Therefore, the LDD regions 44b of the thin film transistor 100b and the LDD regions 44c of the thin film transistor 100c contain the same impurity element, and their concentration profiles in the direction of the thickness are substantially the same. Likewise, the source/drain regions 42b and 42c contain the same impurity element, and their concentration profiles in the direction of the thickness are substantially the same.

With the method described above, the source/drain regions 42d of the thin film transistor 100d and the n-type region 48 of the diode 100a are formed in the same implantation step as the source/drains regions 42b and 42c. Therefore, the source/drain regions 42d and the n-type region 48 contain the same impurity element as the source/drain regions 42b and 42c, and their concentration profiles in the direction of the thickness are substantially the same. Also, since the source/drain regions 42e of the thin film transistor 100e and the p-type region 46 of the diode 100a are formed in the same implantation step, the source/drain regions 42e and the p-type region 46 contain the same impurity element and their concentration profiles in the direction of the thickness are substantially the same.

As described above, in this embodiment, same impurity implantation steps are shared by multiple regions, and therefore the number of manufacturing steps and costs can be reduced. In particular, since one less photomask is used for impurity implantation at a low concentration than the reference process example described later, the manufacturing method according to this embodiment is significantly simpler than the reference process example.

Furthermore, according to the method described above, as n-type impurity is not implanted to the semiconductor layer 16e, which is destined to become the active layer of the p-channel type TFT, it is not necessary to perform a high-concentration p-type impurity implantation (counter doping) to the semiconductor layer 16e. This embodiment is, therefore, more advantageous than the method disclosed in Patent Document 1. The reason is that a counter doping requires a higher concentration impurity implantation. The high concentration impurity implantation not only increases the manufacturing cost and lowers the productivity, but also causes the semiconductor layers to be less crystalline due to the high impurity concentration, possibly leading to a lower product quality. According to this embodiment, counter doping can be avoided without increasing the number of manufacturing steps, which is a favorable outcome.

Figure 2:
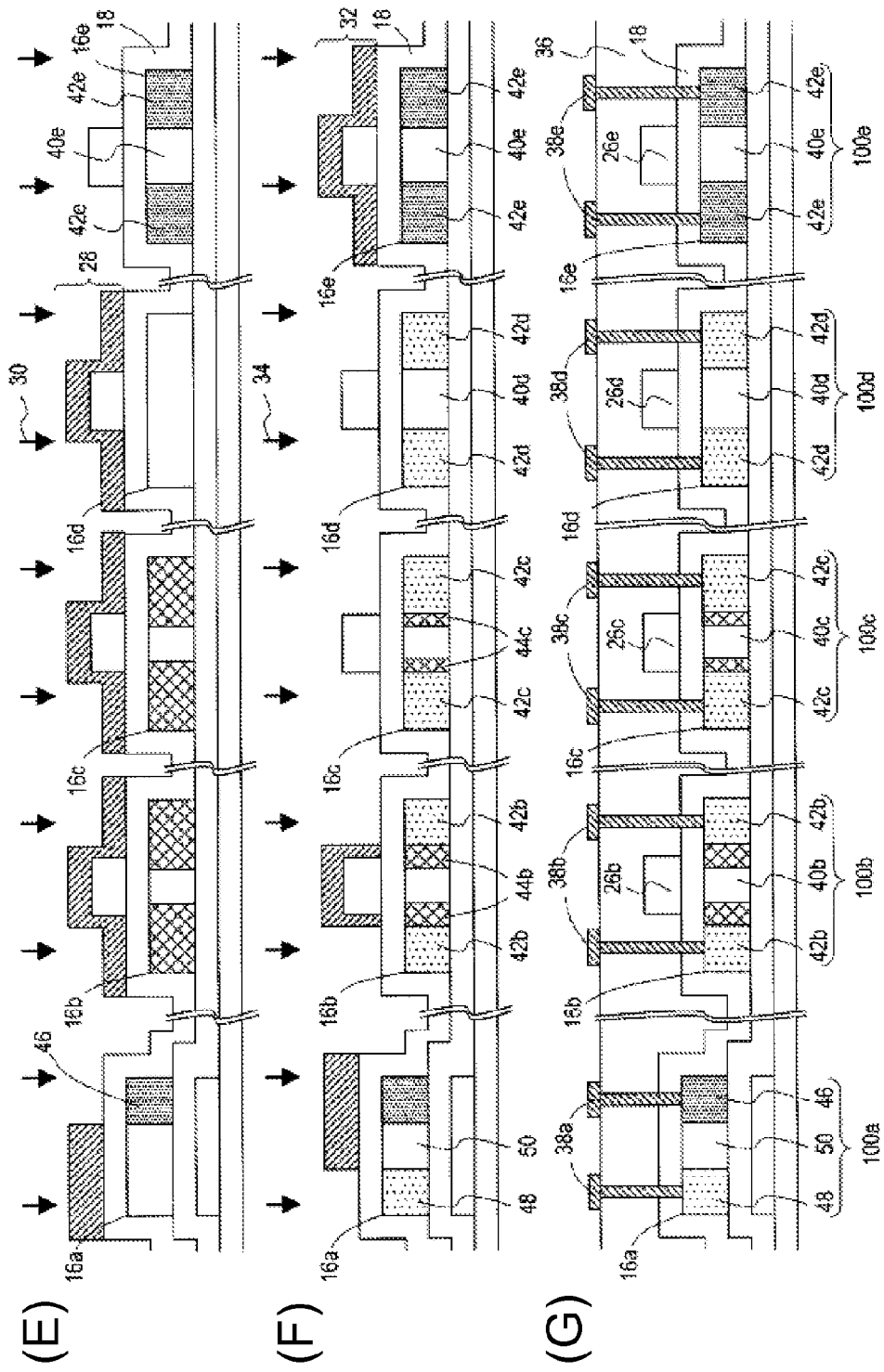
FIGS. 2(E) through 2(G) are schematic cross-sectional views illustrating the manufacturing steps for the semiconductor device according to Embodiment 1 of the present invention.
Figure 3:
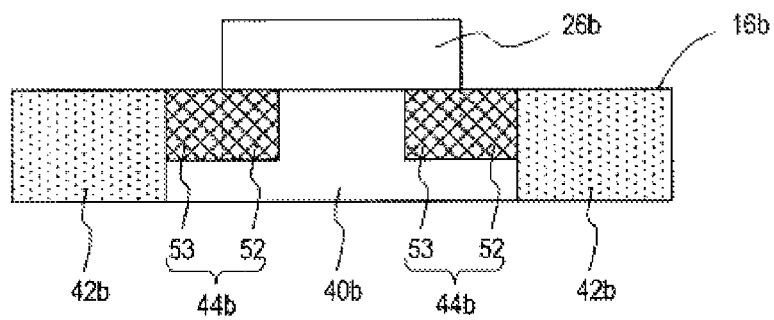
FIGS. 3(a) and 3(b) are cross-sectional views illustrating the positional relationship between the semiconductor layers and a gate electrode of the thin film transistor according to Embodiment 1 of the present invention.
Figure 3:
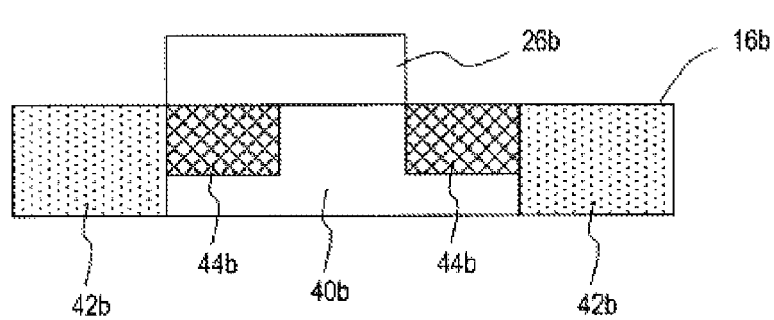

This embodiment also has advantages over the method described in Patent Document 6 as follows. FIG. 3(a) is a schematic enlarged cross-sectional view illustrating the gate electrode 26b and semiconductor layer 16b obtained from the method according to this embodiment. For simplification, the same reference characters are provided for components similar to those shown in FIG. 1 and FIG. 2, and redundant explanations are omitted. In the above method, the mask layers 20 and 32 and gate electrode 26b are designed to provide the configuration illustrated in FIG. 3(a). However, misalignment can occur when the gate electrode 26b is formed. Due to the misalignment, the gate electrode 26b may be disposed at a location that is different from the originally designed location. To avoid any problems associated with such misalignment, the channel length and the size of the gate electrode 26b can be determined in consideration of the achievable alignment precision so that channel region 40b is sufficiently covered by the gate electrode 26b.

Figure 4:
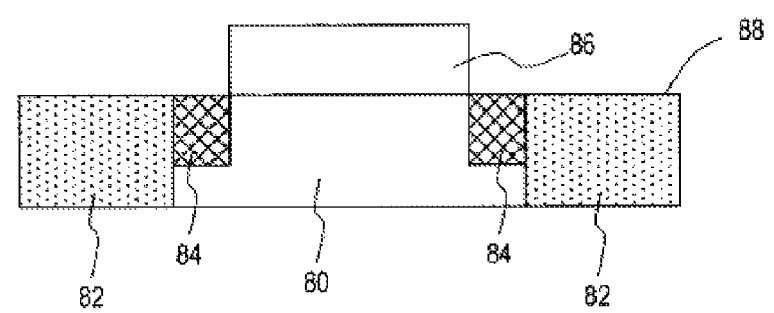
FIGS. 4(a) and 4(b) are cross-sectional views illustrating the positional relationship between the semiconductor layers and a gate electrode of the thin film transistor according to the method described in Patent Document 6.
Figure 4:
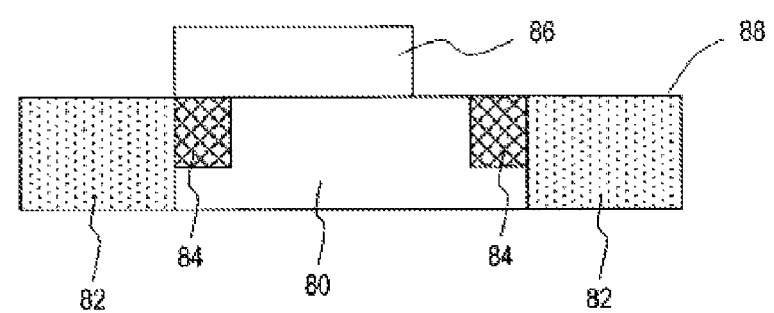

In contrast, according to the method described in Patent Document 6, as shown in FIG. 4(a), gate electrode 86 is disposed over channel region 80 of semiconductor layer 88 also having LDD regions 84 and source/drain regions 82. The gate electrode 86 is designed to have about the same length as the channel region 80 along the channel direction. Therefore, after the LDD regions 84 are formed, the gate electrode 86 needs to be formed by a high-precision positioning so that the ends of the channel region 80 and the ends of gate electrode 86 are properly aligned. Any misalignment of the gate electrode, as shown in FIG. 4(b), can leave part of the channel region 80 not overlapped with the gate electrode 86. This portion of the channel region 80 becomes a resistance region, increasing the ON resistance of the TFT significantly.

As described above, according to this embodiment, the variation of TFT properties resulting from the misalignments is suppressed, and the number of photomasks required can be reduced.

The semiconductor device configuration according to this embodiment just needs to have at least one of each of the diode, the LDD-structured TFT, and the GOLD-structured TET, and does not need to include a TFT of single drain structure or a p-channel type TFT. When a non-transparent substrate is used, any light shielding layer is not necessary on the side of the TFD substrate. Also, the manufacturing method is not limited to the one illustrated in FIGS. 1 and 2. For example, the high-concentration p-type impurity implantation may be conducted after the high-concentration n-type impurity implantation.

The fabrication method, materials, and thickness of each layer included in TFD and TFT, kind of impurities, and the impurity concentration for each LDD region and such may be appropriately selected. The channel lengths of the TFTs and the sizes of the LDD regions (length in the direction of the channel) may be appropriately selected as well. In addition, TFT or TFD of other structures may also be fabricated. For example, a plurality of gate electrodes may be disposed on a single semiconductor layer to form a so-called multigate structured TFT.

Furthermore, as explained below, channel doping may be conducted to adjust the thresholds of TFTs by using the step of the low-concentration impurity ion implantation.

FIGS. 5(A) through (C), and FIG. 6(D) and FIG. 6(E) are cross-sectional views illustrating another fabrication method for the semiconductor device according to this embodiment. For simplification, the same reference characters are used for the similar elements as FIGS. 1 and 2, and redundant explanations are omitted.

Figure 5:
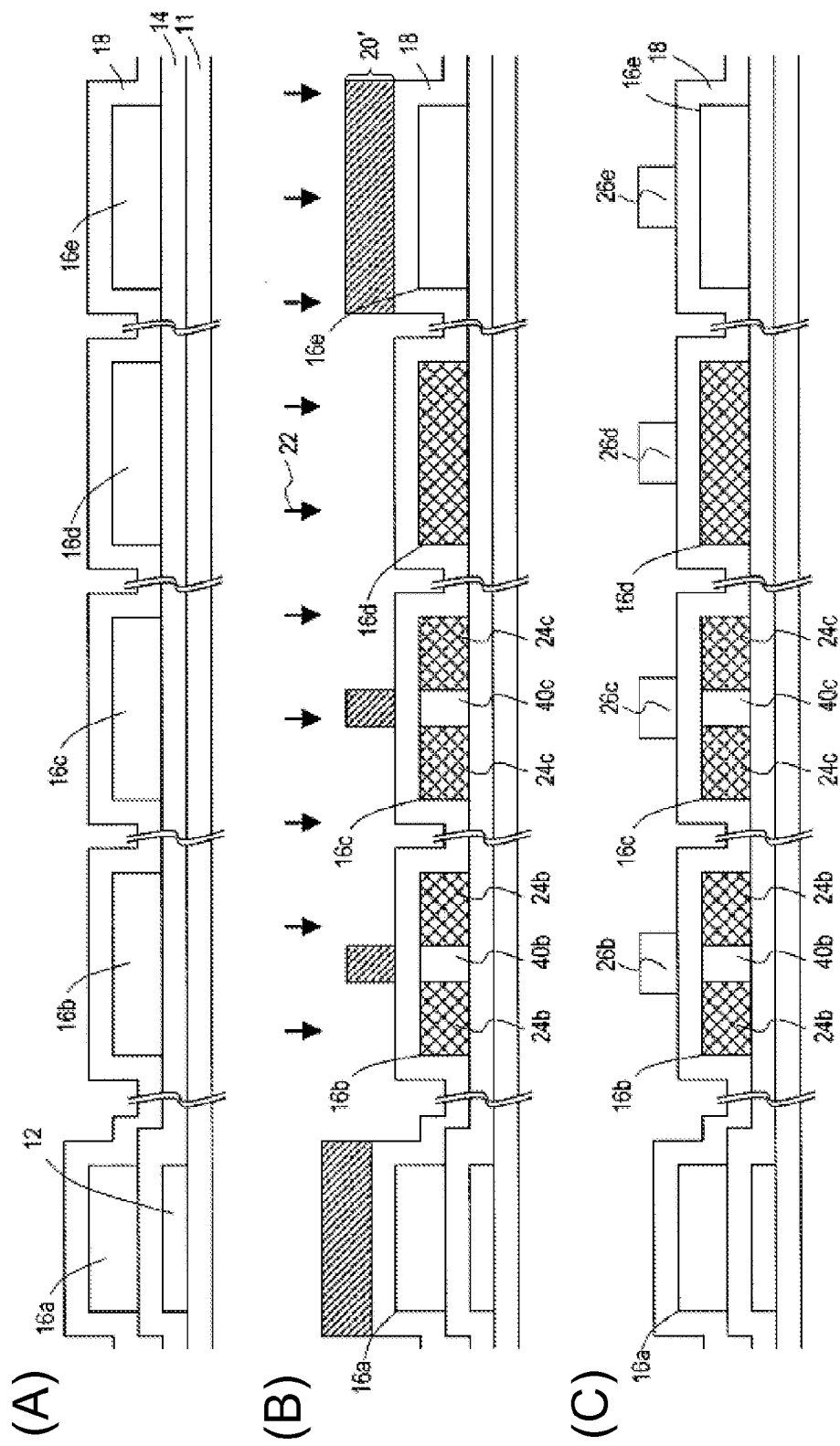
FIGS. 5(A) through 5(C) are cross-sectional views illustrating another method of manufacturing the semiconductor device according to Embodiment 1 of the present invention.

First, as shown in FIG. 5(A), light shielding layer 12, insulating film 14, semiconductor layers 16a through 16e and gate insulating film 18 are formed on substrate 11 in the same manner as described with reference to FIG. 1(A) and FIG. 1(B).

Then, as shown in FIG. 5(B), mask layer 20' is formed on the gate insulating film 18, and n-type impurity ions 22 are implanted at a low concentration to the semiconductor layers 16b through 16d. The mask layer 20' is different from the mask layer 20 shown in FIG. 1(C) in that the mask layer 20' has openings that expose the entire semiconductor layer 16d. Therefore, n-type impurity ions are implanted at a low concentration, not only to the regions that are destined to become the LDD regions and the source/drain regions of the semiconductor layers 16b and 16c, but also to the entire semiconductor layer 16d for forming a TFT of the single drain structure.

Figure 6:
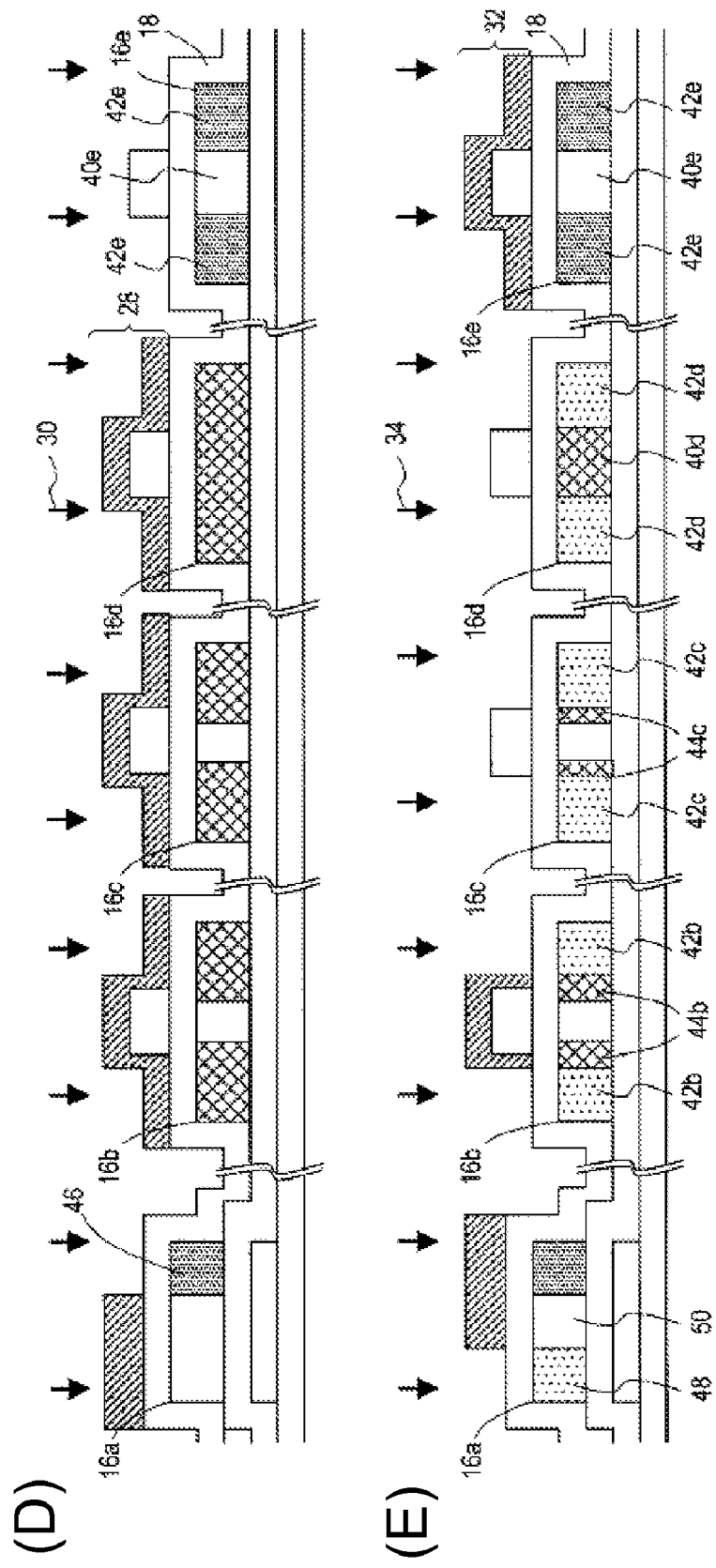
FIGS. 6(D) and 6(E) are cross-sectional views illustrating another method of manufacturing the semiconductor device according to Embodiment 1 of the present invention.

Next, as shown in FIG. 5(C), FIG. 6(D), and FIG. 6(E), with the same method described with reference to FIG. 1(D), FIG. 2(E), and FIG. 2(F), gate electrodes 26b through 26e are formed, p-type impurity ions are implanted at a high concentration, and n-type impurity ions are implanted at a high concentration. Then, an interlayer insulating film (not shown), wirings (not shown) and electrodes (not shown) are formed. This way, a diode, an n-channel type thin film transistor of the LDD structure, n-channel type thin film transistor of the GOLD structure, n-channel type thin film transistor of the single drain structure, and p-channel type thin film transistor are obtained.

Conventionally, to best utilize the self-alignment process, LDD regions were formed using the gate electrode as a mask to fabricate an LDD-structured TFT, and source/drain regions were formed using the gate electrode as a mask to fabricate a GOLD-structured TFT. When these TFTs are fabricated on the same substrate, and the fabrication methods already described for these TFTs are used, the process would be the reference example process that will be described below.

<Reference example process>

FIG. 7(A) through FIG. 7(D) and FIG. 8(E) through FIG. 8(G) are cross-sectional views showing the manufacturing steps of four kinds of TFTs and TFDs according to the reference example. In this example, the fabrication method for a TFD, an n-channel type LDD-structured TFT, an n-channel type GOLD-structured TFT, n-channel type and p-channel type TFTs of single drain structure are formed on the same substrate. For simplification, the same reference characters are used for components similar to those shown in FIG. 1 and FIG. 2, and redundant explanations are omitted.

Figure 7:
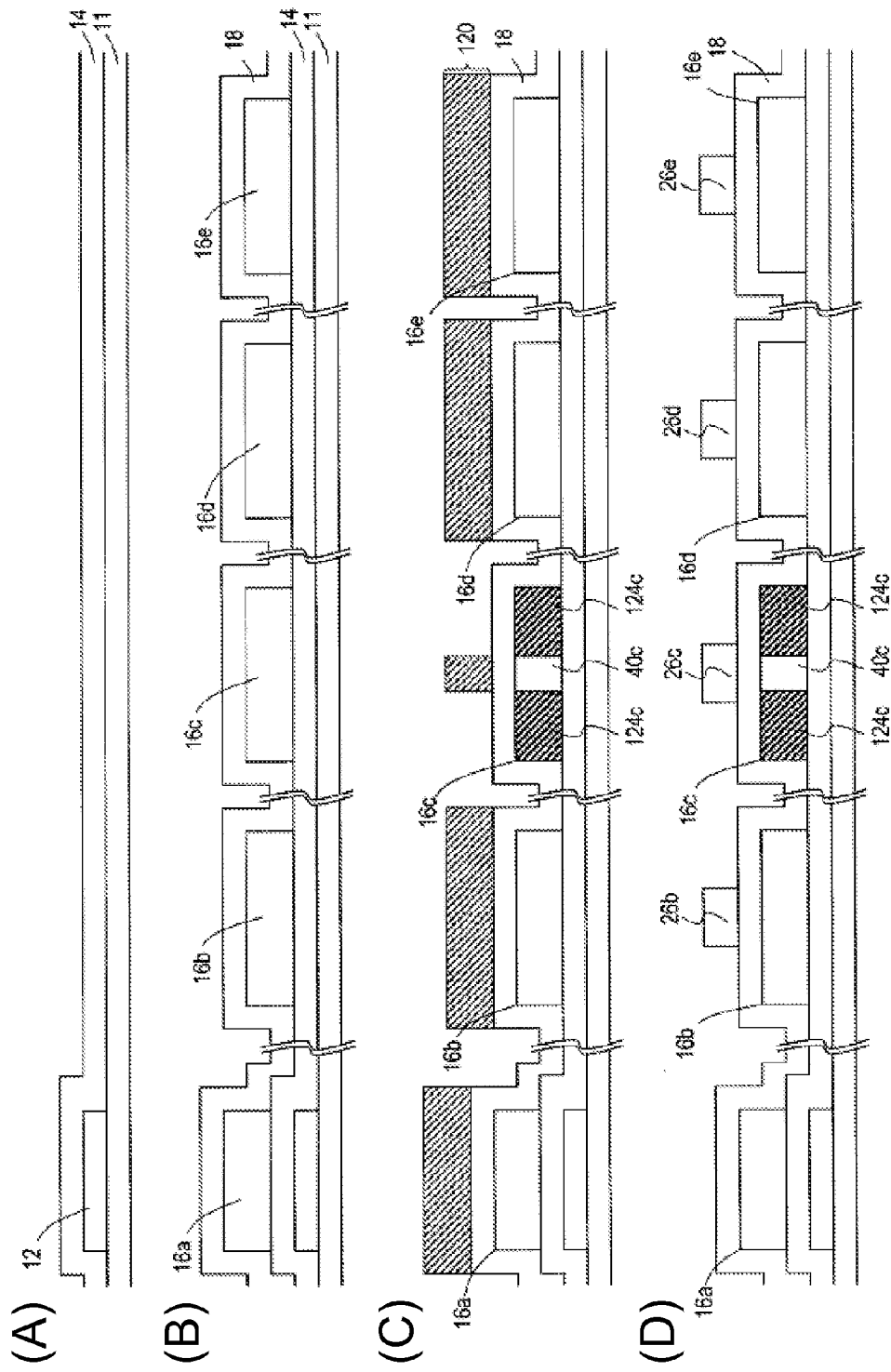
FIGS. 7(A) through 7(D) are cross-sectional views illustrating a method of manufacturing the semiconductor device that is a reference example.

First, as shown in FIGS. 7(A) and 7(B), light shielding layer 12, insulating film 14, semiconductor layers 16a through 16e and gate insulating film 18 are formed on the substrate 11. The method of formation is the same as described with reference to FIGS. 1(A) and (B).

Next, as shown in FIG. 7(C), on the gate insulating film 18, a mask layer 120, which is a resist mask having openings over the portions of the semiconductor layer 16c which are destined to become LDD regions and source/drain regions, is formed. Then, n-type impurity ion implantation (such as phosphorus ions) is performed at a low-concentration through the openings in the mask layer 120 to form impurity ion implantation regions 124c in the semiconductor layer 16c (the first low-concentration ion implantation). The portion of the semiconductor layer 16c where the phosphorus ions were not implanted will become a channel region 40c.

Next, the mask layer 120 is removed, and gate electrodes 26b through 26e are formed on the semiconductor layers 16b through 16e respectively as shown in FIG. 7(D). The gate electrode 26c is formed to cover the channel region 40c, and portions of the impurity ion implantation regions 124c (the portions adjoining the respective sides of the channel region 40c) of the semiconductor layer 16c. Gate electrodes 26b, 26d, and 26e are formed to cover portions of the semiconductor layers 16b, 16d, and 16e that are destined to become channel regions.

Figure 8:
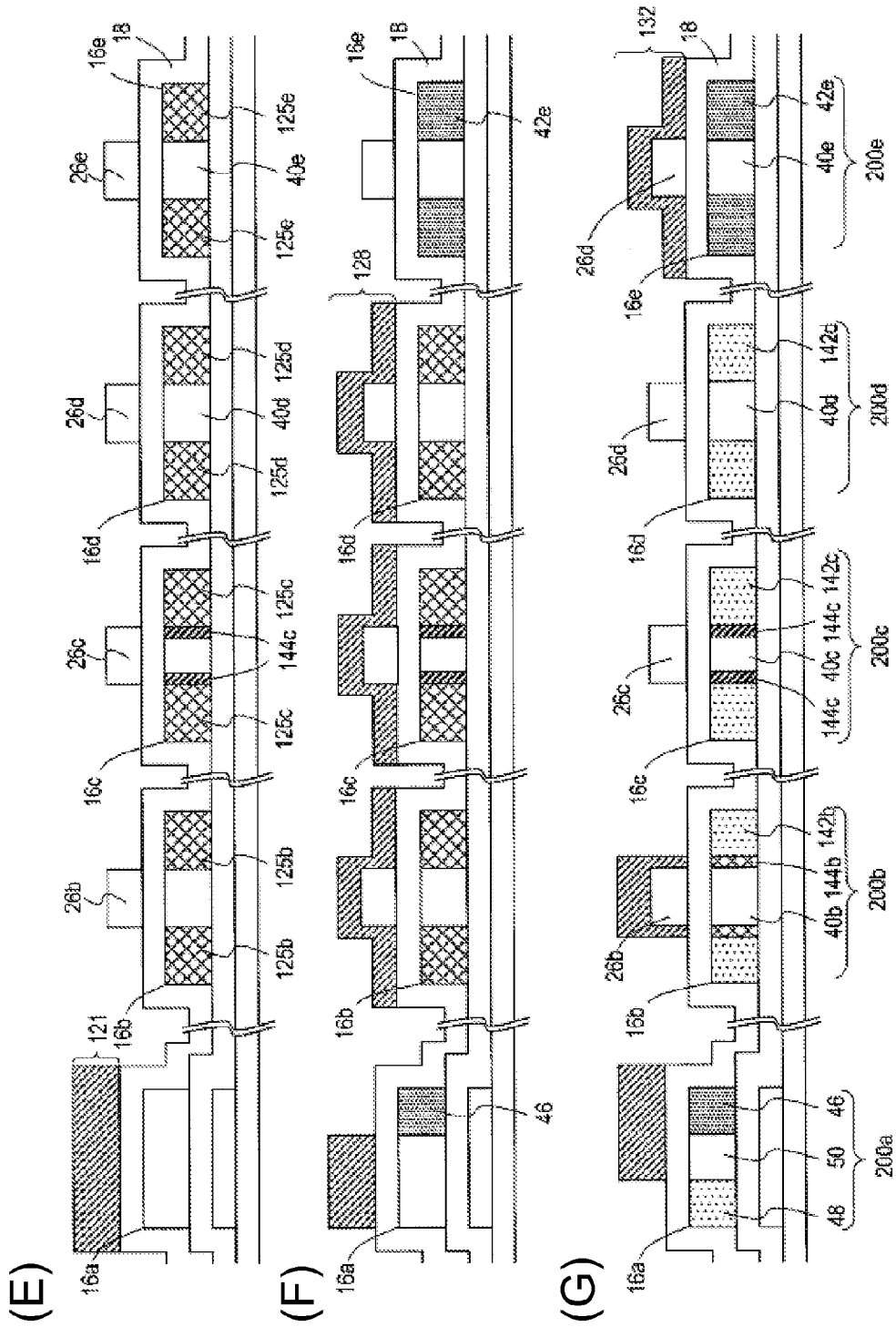
FIGS. 8(E) through 8(G) are cross-sectional views illustrating a method of manufacturing the semiconductor device that is a reference example.

Next, as shown in FIG. 8(E), mask layer 121 is formed to cover the entire semiconductor layer 16a. With the mask layer 121 in place, low-concentration n-type impurity ion implantation (for example, phosphorus ions) is conducted on semiconductor layers 16b through 16e (the second low-concentration ion implantation) to form impurity ion implantation regions 125b in the semiconductor layer 16b. Also, portions of the semiconductor layer 16c that do not overlap the gate electrode 26c are subjected to the phosphorus ion implantation to become the impurity ion implantation regions 125c. Portions of the impurity ion implantation regions 124c that are covered by the gate electrode 26c and were not subjected to the phosphorus ion implantation in this step will become the LDD regions 144c. Furthermore, impurity ion implantation regions 125d and 125e are formed in the semiconductor regions 16d and 16e in the portions not overlapped by the gate electrodes 26d and 26e. Portions of semiconductor layers 16d and 16e where phosphorus ions were not implanted will become channel regions 40d and 40e.

Next, as shown in FIG. 8(F), a mask layer 128, which is a resist mask having openings over a portion of the semiconductor layer 16a and over the entire semiconductor layer 16e, is formed. Then, through the openings in mask layer 128, p-type impurity ions (e.g., boron ions) are implanted at a higher concentration to the semiconductor layers 16a and 16e. By this implantation, p-type region 46 is formed in the semiconductor layer 16a, and source/drain regions 42e are formed in the semiconductor layer 16e. In the previous step, phosphorus ions were implanted to the semiconductor layer 16e. Therefore, for the formation of p-type source/drain regions 42e in this step, the implanted phosphorus ions need to be reversed (counter doped). For counter doping, a higher dose of implantation is required.

Next, the mask layer 128 is removed. Then, as shown in FIG. 8(G), a mask 132, which is a resist film (approximately 1.5 μm thick) is formed. This resist film has openings that expose portions of the gate insulating film 18, which portions are disposed over part of a portion of the semiconductor layer 16a that is not the p-type region 46, both end portions of the impurity ion implantation regions 125b (portions that are destined to become source/drain regions) in the semiconductor layer 16b, and the entire semiconductor layers 16c and 16d. Subsequently, n-type impurity ion implantation (e.g., phosphorus ions) is conducted at a high concentration from above the mask layer 132 and the gate insulating film 18. As a result, the portion of the semiconductor layer 16a where phosphorus ions were implanted through the openings in the mask layer 132 becomes an n-type region 48; the portions of the semiconductor layer 16b where phosphorus ions were implanted through the openings in the mask layer 132 become source/drain regions 142b; and the portions of semiconductor layers 16c and 16d, which are not covered with the gate electrodes 26c and 26d become source/drain regions 142c and 142d, respectively. Also, the portion of the semiconductor layer 16a, where either phosphorus ions or boron ions were not implanted, become intrinsic region 50. The portions in the impurity ion implantation regions 125b of the semiconductor layer 16b, which were shielded by the mask layer 132 and therefore were not subjected to the high-concentration phosphorus ion implantation, will become LDD regions 144b.

In this way, diode 200a, n-channel type LDD-structured thin film transistor 200b, n-channel type GOLD-structured thin film transistor 200c, n-channel type thin film transistor 200d of single drain structure and p-channel type thin film transistor 200e are obtained on the substrate 11.

According to the above-mentioned method of the reference example, seven photomasks in total are needed. More specifically, one photomask is used in each of the following seven steps of: (1) etching for the formation of the light shielding layer 12; (2) etching for the formation of semiconductor layers 16a through 16e; (3) low-concentration phosphorus implantation to semiconductor layer 16c for the formation of the GOLD-structured TFT (the first low-concentration impurity implantation); (4) etching for the formation of the gate electrodes 26b through 26e; (5) low-concentration phosphorus implantation to semiconductor layer 16b for the formation of the LDD-structured TFT (the second low-concentration impurity implantation); (6) high-concentration boron implantation; and (7) high-concentration phosphorus implantation.

In contrast, in the method of the embodiments described with reference to FIGS. 1 and 2, low-concentration phosphorus implantation is performed only once, and therefore the number of photomasks used can be reduced to six. More specifically, one photomask is used in each of the following six steps of: (1) etching for the formation of the light shielding layer 12; (2) etching for the formation of the semiconductor layers 16a through 16e; (3) low-concentration phosphorus implantation to the semiconductor layers 16b and 16c; (4) etching for the formation of the gate electrodes 26b through 26e; (5) high-concentration boron implantation; and (6) high-concentration phosphorus implantation.

As described above, the number of photomasks used according to the present embodiments is one less than that of the process of the reference example process. As a result, the number of manufacturing steps can be significantly reduced. More specifically, the production cost can be reduced by about 7%, and the lead time can be shortened by about 7%. In addition, as the number of photolithography steps can be reduced by one, the decline in the yield rate can be suppressed by about 7%.

(Embodiment 2)

Embodiment 2 of the present invention of semiconductor devices is described below. The semiconductor devices according to this embodiment are display devices having a sensor function. For such display devices, the aforementioned semiconductor devices described with reference to FIGS. 1 and 2 are used.

The display device according to this embodiment, which is equipped with semiconductor devices having a sensor function is, for example, a liquid crystal display device with touch sensor features, which has a display region and a frame region disposed around the display region. The display region has a plurality of display sections (pixels) and a plurality of photo sensor sections. Each display section has a pixel electrode and a pixel switching TFT, and each photo sensor section includes a TFD. For a pixel switching TFT, the LDD-structured thin film transistor 100b shown in FIG. 2(G), for example, is used. For a TFD of the photo sensor section, the diode 100a shown in FIG. 2(G), for example, is used. In the frame region, a display driver circuit for driving each display section is provided, and the driver circuit TFT is used for the driver circuit. For the driver circuit TFT, for example, GOLD-structured thin film transistor 100c shown in FIG. 2(G) is used. The pixel switching TFT and the driver circuit TFT, and the TFD of the photo sensor section are formed on the same substrate, in the manner as discussed in the description of Embodiment 1.

According to this embodiment, the photo sensor section is disposed adjacent to the corresponding display section (such as the primary color pixel). One photo sensor section may be provided for one display section, or a plurality of photo sensor sections may be provided for one display section. Alternatively, one photo sensor section may be provided for a plurality of display sections. For example, one photo sensor section may be provided for a color display pixel composed of the three primary color (RGB) pixels. In this way, the ratio of the number of the photo sensor sections (density) to the number of display sections can be appropriately selected according to the resolution.

Preferably, no color filter is disposed on the viewer's side of the photo sensor section, because the sensitivity of the TFD constituting the photo sensor section can be compromised if the color filter is disposed on the viewer's side of the photo sensor section.

The structure of the display device according to this embodiment is not limited to the structure described above. For example, the display device may be equipped with an ambient light sensor for controlling the display brightness depending on the luminance of the ambient light with a photo sensor TFD disposed in the frame region. Also, the photo sensor section may be utilized as a color image sensor by placing a color filter on the viewer's side of the photo sensor section and establishing the light path to the photo sensor section through the color filter.

The structure of the display device according to this embodiment is described below with reference to figures. In the description, a touchscreen liquid crystal display device equipped with a touchscreen sensor is used as an example.

Figure 9:
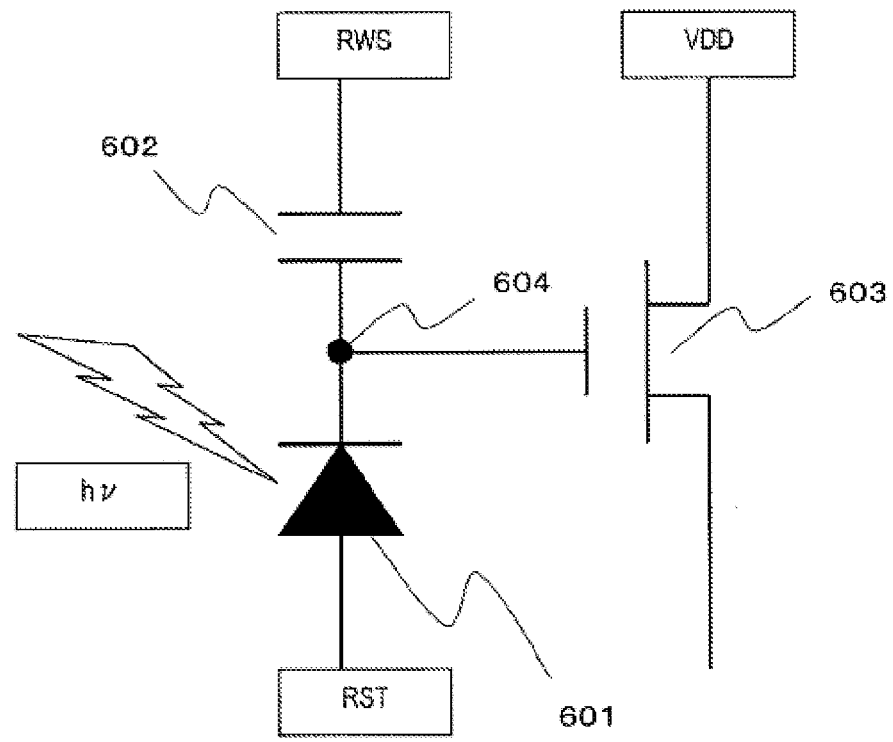
FIG. 9 is a circuit diagram of a photo sensor TFD according to Embodiment 2 of the present invention.

FIG. 9 is a circuit diagram illustrating the structure of the photo sensor section disposed in the display region. The photo sensor section has a photo sensor thin film diode 601, capacitor 602 for storing signals, and thin film transistor 603 for retrieving signals stored in the capacitor 602. When RST signal is input, RST potential is written at node 604, and the potential of node 604 drops due to the leakage caused by the light, the gate potential of the thin film transistor 603 changes which either opens or closes the TFT gate. VDD signal can then be outputted.

Figure 10:
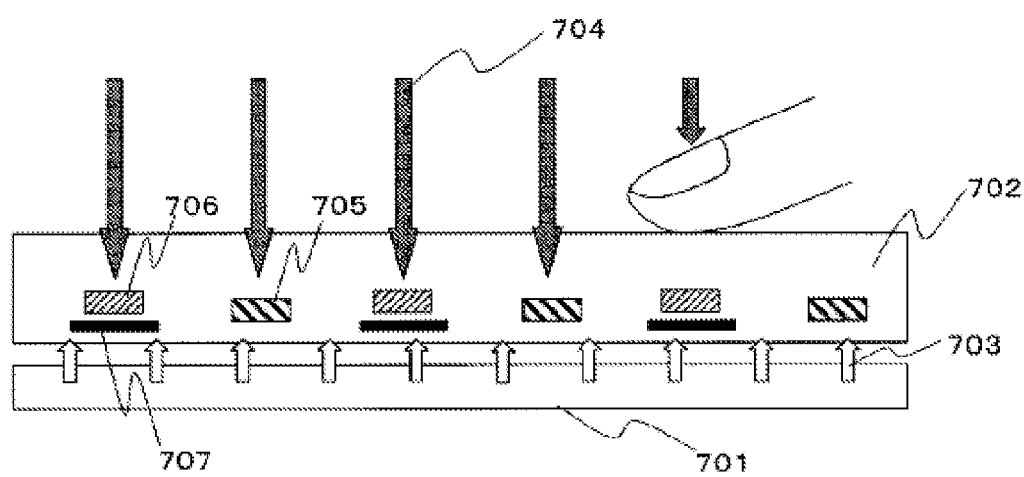
FIG. 10 is a view illustrating a configuration of a photo sensor type touchscreen according to Embodiment 2 of the present invention.

FIG. 10 is a schematic cross-sectional view illustrating an example of the active matrix touchscreen liquid crystal display device. In this example, one photo sensor section is arranged for each pixel.

A liquid crystal display device shown in the figure has a liquid crystal module 702 and a backlight 701 disposed on the back of the liquid crystal module 702. Although not illustrated here, liquid crystal module 702 is composed of, for example, a transparent backside substrate, a front side substrate disposed opposite the backside substrate, and a liquid crystal layer interposed between these substrates. The liquid crystal module 702 has a plurality of display sections (primary color pixels), and each display section has a pixel electrode (not shown) and a pixel switching thin film transistor 705 which is connected to the pixel electrode. In addition, the photo sensor section including the thin film diode 706 is disposed adjacent to each display section. Although not illustrated, a color filter is disposed on the viewer's side of the display section. However, no color filter is disposed on the viewer's side of the photo sensor section. A light shielding layer 707 is interposed between the thin film diode 706 and the backlight 701. The light from the backlight 701 is blocked by the light shielding layer 707 and therefore does not enter the thin film diode 706. Only ambient light 704 enters the thin film diode 706. The entry of the ambient light 704 is sensed by the thin film diode 706, which realizes a light-sensing touchscreen. The light shielding layer 707 needs to be disposed at least to ensure that the light from the backlight 701 does not enter the intrinsic region of the thin film diode 706.

Figure 11:
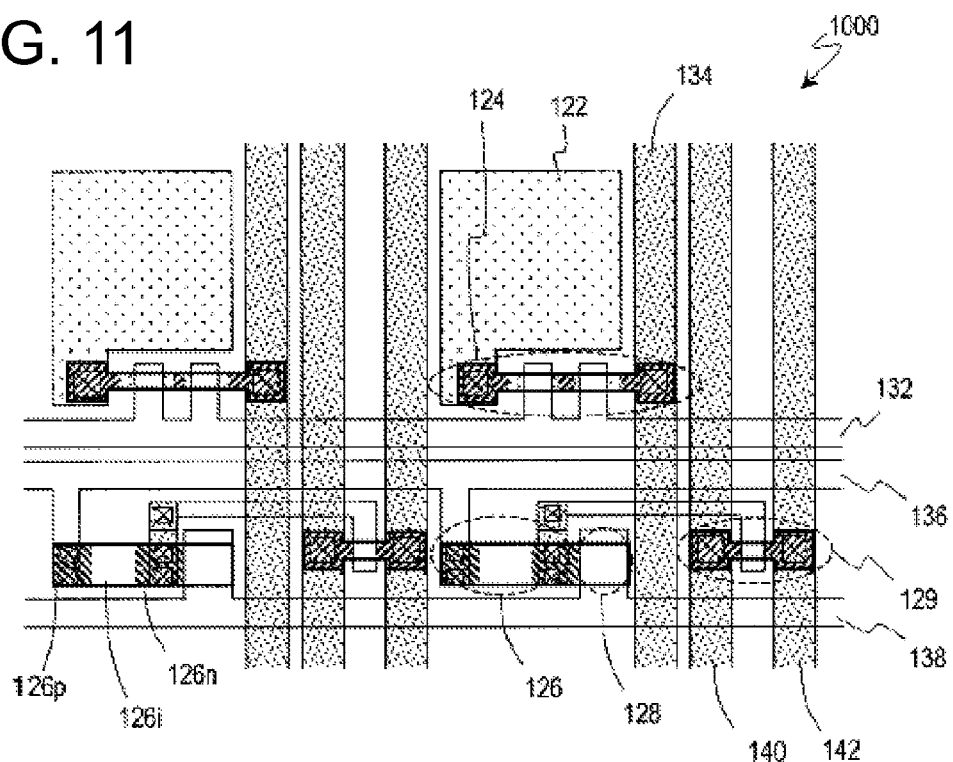
FIG. 11 is a schematic plan view illustrating a backside substrate of the liquid crystal display device equipped with a touchscreen according to Embodiment 2 of the present invention.

FIG. 11 is a schematic plan view showing an example of the backside substrate in a liquid crystal display device equipped with an active matrix touchscreen. Although the liquid crystal display device according to this embodiment has a large number of pixels (R, G, and B pixels), only two pixels are shown in FIG. 11 for the purpose of simplification.

Backside substrate 1000 is equipped with a plurality of display sections (pixels), each of which has a pixel electrode 122 and a pixel switching thin film transistor 124, and a photo sensor section that is disposed adjacent to each display section, and that has a photo sensor photo diode 126, a capacitor 128 for storing signals, and a follower thin film transistor 129 for the photo sensor.

The thin film transistor 124 has the LDD structure. The source region of the thin film transistor 124 is connected to the pixel source bus line 134, and the drain region is connected to the pixel electrode 122. Thin film transistor 124 is turned on/off by the signals from the pixel gate bus line 132. With this configuration, voltages are applied to the liquid crystal layer by the pixel electrode 122 and an opposite electrode formed on the front side substrate that is disposed opposite the backside substrate 1000, to change the alignment condition of the liquid crystal layer and to display images.

The photo sensor photodiode 126, having the same structure as the TFD of Embodiment 1, for example, has p$^+$-type region 126p, n$^+$-type region 126n, and intrinsic region 126i, which is interposed between the 126p region and the 126n region. Signal storing capacitor 128 uses the gate electrode layer and the Si layer as electrodes, and develops an electrical capacitance with a gate insulating film. The p$^+$-type region 126p of the photo sensor photodiode 126 is connected to the photo sensor RST signal line 136, and the n$^+$-type region 126n is connected to the bottom electrode (Si layer) of the signal storing capacitor 128. Through the signal storing capacitor 128, the n$^+$-type region 126n is further connected to the photo sensor RWS signal line 138. Moreover, n$^+$-type region 126n is connected to the gate electrode layer of the photo sensor follower thin film transistor 129. The source/drain regions of the photo sensor follower thin film transistor 129 are connected to the photo sensor VDD signal line 140 and the photo sensor COL signal line 142, respectively.

As described above, the photo sensor photodiode 126, signal storing capacitor 128, and the photo sensor follower thin film transistor 129 correspond to the thin film diode 601, the capacitor 602, and the thin film transistor 603, respectively, of the driver circuit shown in FIG. 9, constituting the photo sensor driver circuit. The light sensing operation of the driver circuit is described below.

(1) First, through RWS signal line 138, RWS signals are written to the signal storing capacitor 128. Then, a positive electric field is generated on the side of the n$^+$-type region 126n of the photo sensor photodiode 126, and the reverse biased condition against the photo sensor photodiode 126 is established. (2) At the photo sensor photodiode 126 located in the region exposed to the light on the substrate surface, a light leakage occurs to eliminate the electric charge towards the side of the RST signal line 136. (3) Then, the potential drops on the side of the n$^+$-type region 126n, and with this potential change, the gate voltage applied to the photo sensor follower thin film transistor 129 changes. (4) VDD signal from the VDD signal line 140 has been applied on the source side of the photo sensor follower thin film transistor 129. When the gate voltage changes as described above, the amount of the current that flows into COL signal line 142, which is connected to the drain side, also changes. As a result, the electric signals obtained in this manner can be retrieved from the COL signal line 142. (5) RST signal is written from the COL signal line 142 to the photo sensor photodiode 126 to reset the potential of the signal storing capacitor 128. Operations (1) through (5) are repeated as scanning is conducted to perform the light sensing.

The structure of the backside substrate of the touchscreen liquid crystal display device according to this embodiment is not limited to the structure as illustrated in FIG. 11. For example, auxiliary capacity (Cs) may be provided for each pixel switching TFT. Also, although the photo sensor section is disposed adjacent to each of the R, G, and B pixels in the example illustrated in the figure, as mentioned earlier, one photo sensor section may be provided for a set of three pixels (color display pixels), which is composed of R, G, and B pixels.

Here, FIG. 10 is referred to again. According to the above example, as shown in the cross-sectional view of FIG. 10, thin film diode 706 is disposed in the display region and used as a touchscreen sensor. However, the thin film diode 706 can also be formed outside the display region and used as an ambient light sensor that controls the luminance of backlight 701 based on the luminance of the ambient light 704.

Figure 12:
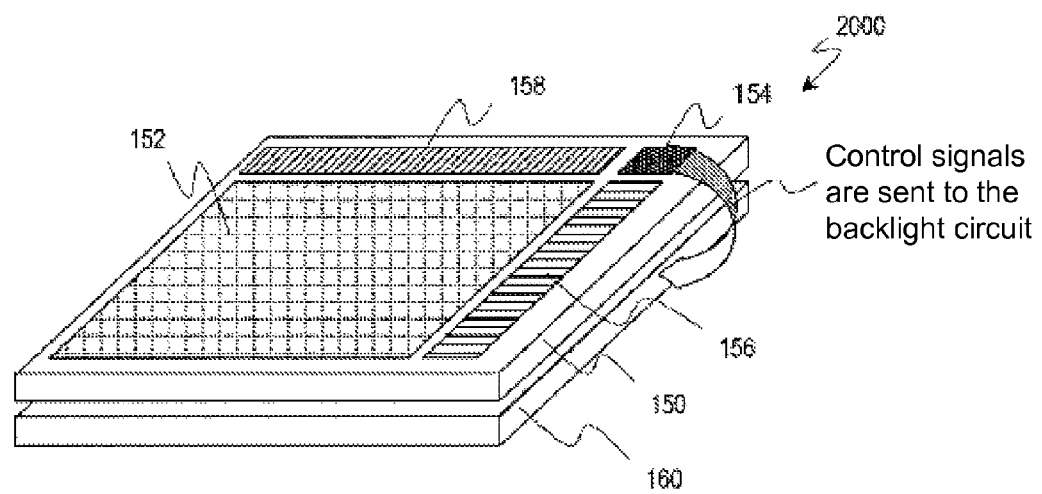
FIG. 12 is a perspective view illustrating a liquid crystal display device equipped with an ambient light sensor according to Embodiment 2 of the present invention.

FIG. 12 is a perspective view showing a liquid crystal display device equipped with an ambient light sensor. Liquid crystal display device 2000 has an LCD substrate 150, which includes a display region 152, a gate driver 156, a source driver 158 and a photo sensor section 154, and a backlight 160 disposed on the back side of the LCD substrate 150. The portion of the LCD substrate 150, which surrounds the display region 152, and has the drivers 156 and 158 and the photo sensor section 154, may be referred to as a "frame region."

The luminance of the backlight 160 is controlled by a backlight control circuit (not shown). In addition, although not shown in the figure, TFTs are used in the display region 152 and drivers 156 and 158, and TFDs are used in the photo sensor section 154. The photo sensor section 154 generates luminance signals based on the luminance of the ambience light, and sends the signals to the backlight control circuit using the connection through flexible substrates. The backlight control circuit generates backlight control signals in accordance with the luminance signals, and sends them to the backlight 160.

The present invention also provides an organic EL display device equipped with an ambient light sensor. Such organic EL display device may have the structure in which the display section and the photo sensors section are disposed on the same substrate, in a manner similar to that of the liquid crystal display device illustrated in FIG. 12. However, the backlight 160 does not have to be provided on the back side of the substrate. In this case, the photo sensor section 154 is connected to the source driver 158 through wirings on the substrate 150, and luminance signals from the photo sensor section 154 are sent to the source driver 158. The source driver 158 changes the luminance of the display section 152 according to the luminance signal.

Embodiments of the present invention are described as above. The present invention, however, is not limited to those embodiments. Various modifications based on the technical idea of the present invention are possible. Using the TFTs of the present invention, a circuit for analog drive or a circuit for digital drive can also be constituted on the glass substrate simultaneously. For example, a circuit for analog drive may include a source side driver circuit, a pixel section and a gate side driver circuit. The source side driver circuit has a shift register, buffer, and a sampling circuit (transfer gate). The gate side driver circuit has a shift register, a level shifter, and a buffer. If needed, a level shifter circuit may be provided between the sampling circuit and the shift register. In addition, memory chips and microprocessors can also be formed in accordance with the fabrication steps of the present invention.

Industrial Applicability

According to the present invention, the number of photomasks required for manufacturing the semiconductor devices in which thin film transistors and diodes are disposed on the same substrate can be reduced. As a result, the number of manufacturing steps and manufacturing costs can be significantly reduced.

The present invention can preferably be applied in various semiconductor devices equipped with thin film transistors and diodes, including active matrix substrates and display devices such as liquid crystal display devices, and organic EL display devices.

Description of Reference Characters
  100a diode
  100b~100e thin film transistors
  11 substrate
  12 light shielding layer
  14 insulating film
  16a~16e semiconductor layers
  18 gate insulating film
  20, 28, 32 mask layers
  22, 30, 34 impurity ions
  36 interlayer insulating film
  38a-38e electrodes/wirings
  24b, 24c low-concentration impurity ion implantation regions
  26b-26e gate electrodes
  40b-40e channel regions
  42b-42e source/drain regions
  44b, 44c LDD regions
  46 p-type region
  48 n-type region
  50 intrinsic region

The invention claimed is:

1. A manufacturing method for semiconductor device having at least two thin film transistors and a diode on a same substrate, comprising the steps of:
  (a) forming island-shaped first and second semiconductor layers for formation of thin film transistors, and an island-shaped third semiconductor layer for formation of a diode;
  (b) forming a gate insulating film covering said first, second, and third semiconductor layers;
  (c) forming a mask layer having openings exposing portions of said gate insulating film that are located over portions of said first and second semiconductor layers, which portions are destined to become low-concentration impurity regions, and source and drain regions, respectively;
  (d) forming first conductivity type implantation regions in said first and second semiconductor layers, by implanting a first conductivity type impurity to said first and second semiconductor layers through the openings of said mask layer from above said gate insulating film;
  (e) forming on said gate insulating film a first gate electrode and a second gate electrode covering portions of said first conductivity type implantation region and regions that are destined to become channel regions of said first and second semiconductor layers, respectively;
  (f) forming another mask layer having openings exposing portions of said gate insulating film, which exposed portions are located over two end portions of said first conductivity type implantation region of said first semiconductor layer, the entire said second semiconductor layer, and over a portion of said third semiconductor layer; and
  (g) implanting said first conductivity type impurity into said first, second and third semiconductor layers, through the openings in said another mask from above said gate insulating film to form source and drain regions in said first semiconductor layer, source and drain regions in portions of said second semiconductor layer that are not covered by said second gate electrode, and a first conductivity type region in said third semiconductor layer, regions of said first conductivity type implantation regions where said source and drain regions are not formed becoming low-concentration impurity regions.

2. The manufacturing method for a semiconductor device according to claim 1, wherein said method further includes the step of (h) implanting a second conductivity type impurity, which is different from said first conductivity type impurity, into another portion of said third semiconductor layer to form a second conductivity type region in said third semiconductor layer.

3. The manufacturing method for a semiconductor device according to claim 2, wherein said step (a) further includes a step of forming island-shaped fourth semiconductor layer for forming another thin film transistor, the method further including the steps of:
- (i1) forming a fourth gate electrode covering a portion of said fourth semiconductor layer that is destined to become a channel region, and
- (i2) implanting said second conductivity type impurity into said fourth semiconductor layer using said fourth gate electrode as a mask to form source and drain regions in said fourth semiconductor layer, wherein said step (i1) and said step (e) are conducted simultaneously, and said step (i2) and said step (h) are conducted simultaneously.

4. The manufacturing method of a semiconductor device according to claim 3, wherein said first conductivity type impurity is not implanted into said fourth semiconductor layer in said steps (d) and (g).

5. The manufacturing method for a semiconductor device according to claim 3, wherein said step (d) further includes a step of implanting said first conductivity type impurity to the entire said fourth semiconductor layer.

6. The manufacturing method for a semiconductor device according to claim 2, wherein said first conductivity type is n-type and said second conductivity type is p-type.

7. The manufacturing method for a semiconductor device according to claim 1,
wherein said step (a) further includes the step of forming an island-shaped fifth semiconductor layer for forming another thin film transistor, said step including steps of:
- (j1) forming a fifth gate electrode covering a portion of said fifth semiconductor layer that is destined to become a channel region; and
- (j2) implanting said first conductivity type impurity to said fifth semiconductor layer using said fifth gate electrode as a mask to form source and drain regions in said fifth semiconductor layer, wherein said first conductivity type impurity is not implanted into said fifth semiconductor layer in said step (d), and
wherein said step (j1) and said step (e) are conducted simultaneously, and said step (j2) and said step (g) are conducted simultaneously.

8. A semiconductor device having a first thin film transistor, a second thin film transistor, and a diode on a same substrate,
wherein each one of said first and second thin film transistors has a semiconductor layer including a channel region, source and drain regions respectively disposed adjacent to respective sides of said channel region, said source and drain region containing a first conductivity type impurity, and low concentration impurity regions interposed between said channel region and said drain region and between said channel region and said source region, said low concentration impurity regions containing said first conductivity type impurity at a lower concentration than said source region and said drain region; a gate insulating film formed on said semiconductor layer; and a gate electrode disposed in such a manner as to overlap at least with said channel region,
wherein said diode has a semiconductor layer including a first conductivity type region containing the first conductivity type impurity and a second conductivity type region containing a second conductivity type impurity,
wherein, in said first thin film transistor, said gate electrode overlaps with a portion of said low concentration impurity regions,
wherein, in said second thin film transistor, said gate electrode overlaps with the entire said low concentration impurity regions, and
wherein said low concentration impurity regions and said source and drain regions of each one of said first and second thin film transistors have a same impurity element; concentration profiles of said first conductivity type impurity in the direction of a thickness of said low concentration impurity regions of the first thin film transistor and of said low concentration impurity regions of the second thin film transistor are substantially the same; and concentration profiles of said first conductivity type impurity in the direction of a thickness of said source and drain regions of the first thin film transistor and of said source and drain regions of the second thin film transistor are substantially the same.

9. The semiconductor device according to claim 8,
wherein, in said second thin film transistor, ends of said gate electrode are aligned with ends of said source region and said drain region, and
wherein, in said first thin film transistor, ends of said gate electrode are not aligned with any of an end of said low concentration impurity region, an end of said source region or an end of said drain region.

10. The semiconductor device according to claim 8, further comprising a third thin film transistor formed on said substrate,
wherein said third thin film transistor has a semiconductor layer including a channel region, and source and drain regions respectively disposed on respective sides of said channel region and containing said second conductivity type impurity; a gate insulating film formed on said semiconductor layer; and a gate electrode disposed on said gate insulating film,
wherein concentration profiles of said second conductivity type impurity in the direction of a thickness of the second conductivity type region of said diode and of said source and drain regions of said third thin film transistor are substantially the same, and
wherein said source and drain regions of said third thin film transistor do not contain said first conductivity type impurity.

11. The semiconductor device according to claim 8, further comprising a fourth thin film transistor formed on said substrate,
wherein said fourth thin film transistor has a semiconductor layer including a channel region, source and drain regions respectively disposed on respective sides of said channel region and containing said first conductivity type impurity; a gate insulating film formed on said semiconductor layer; and a gate electrode disposed on said gate insulating film,
wherein concentration profiles of said first conductivity type impurity in the direction of a thickness of the first conductivity type region of said diode and of said source and drain regions of said fourth thin film transistor are substantially the same, and
wherein, in said fourth thin film transistor, ends of said source and drain regions of said fourth thin film transistor are aligned with ends of said gate electrode.

* * * * *